(12) United States Patent
Liu et al.

(10) Patent No.: US 11,596,080 B2
(45) Date of Patent: Feb. 28, 2023

(54) APPARATUS FOR HOUSING STORAGE PROCESSOR, AND STORAGE SERVER

(71) Applicant: EMC IP Holding Company LLC, Hopkinton, MA (US)

(72) Inventors: Aiqin Liu, Shanghai (CN); Xu Chen, Chengdu (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 232 days.

(21) Appl. No.: 16/836,372

(22) Filed: Mar. 31, 2020

(65) Prior Publication Data

US 2020/0344908 A1 Oct. 29, 2020

(30) Foreign Application Priority Data

Apr. 24, 2019 (CN) .......................... 201910335404.9

(51) Int. Cl.
*H05K 7/20* (2006.01)
*H05K 7/14* (2006.01)
*H01F 7/02* (2006.01)
*F04D 25/14* (2006.01)

(52) U.S. Cl.
CPC ............ *H05K 7/1489* (2013.01); *H01F 7/02* (2013.01); *F04D 25/14* (2013.01); *H05K 7/20145* (2013.01); *H05K 7/20736* (2013.01)

(58) Field of Classification Search
CPC ................ G06F 1/20; G06F 2200/201; H05K 7/20209; H05K 7/20836; H05K 7/20172; H05K 7/20145; H05K 7/2019; H05K 7/20181; H05K 7/20136

USPC .......... 361/695, 679.33, 679.46, 679.4, 690, 692; 165/104.33, 80.3; 454/353, 184, 351, 454/347, 358; 415/146, 26

See application file for complete search history.

(56) References Cited

U.S. PATENT DOCUMENTS

| 8,678,524 | B2 * | 3/2014 | Green | H05K 7/1489 312/319.1 |
| 9,155,220 | B2 * | 10/2015 | Yokosawa | H05K 7/183 |
| 10,206,306 | B2 * | 2/2019 | Drake | H05K 7/18 |
| 11,006,543 | B2 * | 5/2021 | Huangfu | H05K 5/03 |

(Continued)

FOREIGN PATENT DOCUMENTS

| CN | 101315574 | 12/2008 |
| CN | 201229539 | 4/2009 |

(Continued)

*Primary Examiner* — Mandeep S Buttar
(74) *Attorney, Agent, or Firm* — BainwoodHuang

(57) ABSTRACT

An apparatus for housing a storage processor includes first and second side portions each extending in a plane defined by a first direction and a second direction, and separated from each other in a third direction; first and second flapper components disposed between the first side portion and the second side portion, extending in a first plane and a second plane, respectively, and rotatable about a first axis and a second axis, respectively, the first flapper component coupled to the first side portion and having a first end face, the second flapper component coupled to the second side portion and having a second end face; and first and second magnetic components disposed in the first end face and the second end face, respectively, and configured to be coupled to each other by a magnetic force so as to couple the first end face to the second end face.

23 Claims, 11 Drawing Sheets

(56) References Cited

U.S. PATENT DOCUMENTS

| | | |
|---|---|---|
| 2004/0095717 A1 | 5/2004 | Hsu et al. |
| 2009/0057511 A1 | 3/2009 | Liu et al. |
| 2014/0144858 A1* | 5/2014 | Yokosawa ............... H05K 7/183 |
| | | 211/182 |
| 2014/0177164 A1 | 6/2014 | Stewart |
| 2014/0179214 A1 | 6/2014 | Rinke et al. |
| 2016/0234962 A1* | 8/2016 | Shinsato ............... G11B 33/128 |
| 2016/0235201 A1* | 8/2016 | Söö ........................ A47B 96/20 |
| 2017/0205835 A1 | 7/2017 | Holland et al. |
| 2020/0214164 A1 | 7/2020 | Doll et al. |
| 2021/0410314 A1* | 12/2021 | Chen .................... H05K 7/1489 |

FOREIGN PATENT DOCUMENTS

| | | |
|---|---|---|
| CN | 102866745 | 1/2013 |
| CN | 103378084 | 10/2013 |
| CN | 103729041 | 4/2014 |
| CN | 103766014 | 4/2014 |
| CN | 104166444 | 11/2014 |
| CN | 107219897 | 9/2017 |
| CN | 107646097 | 1/2018 |
| CN | 107872938 | 4/2018 |
| CN | 107885283 | 4/2018 |
| CN | 109074830 | 12/2018 |
| CN | 208538723 | 2/2019 |

\* cited by examiner

APPARATUS FOR HOUSING STORAGE PROCESSOR, AND STORAGE SERVER

CROSS REFERENCE TO RELATED APPLICATION

This application claims priority to Chinese Patent Application No. CN201910335404.9, on file at the China National Intellectual Property Administration (CNIPA), having a filing date of Apr. 24, 2019, and having "INNOVATIVE FLAPPER LATCHING MECHANISM WITH MAGNETIC PADS" as a title, the contents and teachings of which are herein incorporated by reference in their entirety.

FIELD

Embodiments of the present disclosure relate to the field of a storage processor, and more particularly to an apparatus for housing a storage processor included in a storage server, and a storage server including the apparatus.

BACKGROUND

Recently, storage servers for providing data storage services have been widely applied. The storage server generally comprises a storage array and a storage processor. As an amount of data to be stored increases, a need to improve a capacity and a density of the storage array also increases accordingly. The increase in the capacity and the density of the storage array results in a significant increase in a power density of the storage server, particularly the storage array.

The increase of the power density of the storage server poses many challenges, one of which involves a heat dissipation of the storage array. It is desirable to provide a cooling mechanism to improve the heat dissipation of the storage array to address the challenge of increasing the power density. A scheme for providing a cooling airflow has been proposed to improve the heat dissipation. As the demand for the improved heat dissipation of the storage array continues to increase, the amount of the cooling airflow increases accordingly. The increase in the amount of the cooling airflow causes a backflow of the cooling airflow to become stronger. It is desirable to provide an effective solution to overcome the backflow of the cooling airflow in order to avoid adverse impacts caused by the backflow of the cooling airflow on the heat dissipation of the cooling airflow.

SUMMARY

Embodiments of the present disclosure provide an apparatus for housing a storage processor and a storage server, which provide the improved heat dissipation of the storage server.

In a first aspect, there is provided an apparatus for housing a storage processor. The apparatus includes: first and second side portions each extending in a plane defined by a first direction and a second direction orthogonal to the first direction, the first and second side portions separated from each other in a third direction orthogonal to the first direction and the second direction; first and second flapper components disposed between the first side portion and the second side portion, extending in a first plane and a second plane parallel to the second direction, respectively, and rotatable about a first axis and a second axis parallel to the second direction, respectively, the first flapper component coupled to the first side portion and having a first end face, the second flapper component coupled to the second side portion and having a second end face; and first and second magnetic components disposed in the first end face and the second end face, respectively, and configured to be coupled to each other by a magnetic force so as to couple the first end face to the second end face.

In a second aspect, there is provided a storage server. The storage server includes: a storage array configured to store data; a storage processor configured to be electrically coupled to the storage array; and the apparatus for housing the storage processor as mentioned above.

The Summary is to introduce a selection of concepts in a simplified form that are further described below in the Detailed Description. This Summary is not intended to identify key features or essential features of the present disclosure, nor is it intended to limit the scope of the present disclosure.

BRIEF DESCRIPTION OF THE DRAWINGS

Other objectives, advantages and features of the present disclosure will become more apparent through the detailed description of example embodiments of the present disclosure with reference to the accompanying drawings, in which.

DETAILED DESCRIPTION

Figure 1A:
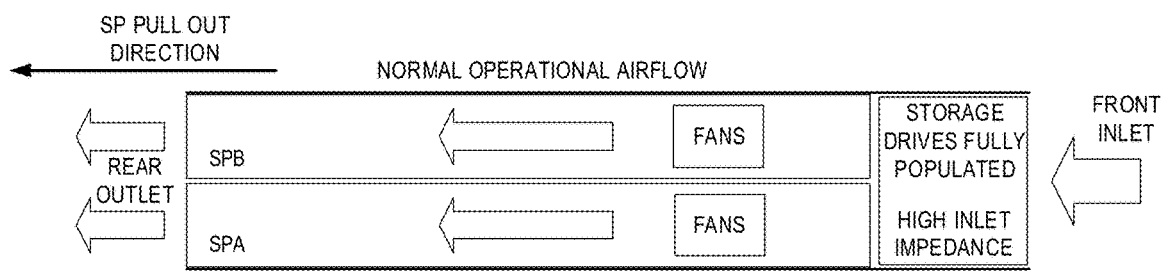
FIGS. 1A and 1B illustrate schematic cross-sectional views of a cooling airflow in a storage server.

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

Principles of the present disclosure will now be described with reference to several example embodiments illustrated in the drawings. Although some preferred embodiments of the present disclosure are shown in the drawings, it would be appreciated that description of those embodiments is merely for the purpose of enabling those skilled in the art to better understand and further implement the present disclosure and is not intended for limiting the scope disclosed herein in any manner. In addition, values described in example embodiments are only by way of example, aspects of embodiments of the present disclosure are not limited to these values, and there might be other ranges of values.

Figure 1B:
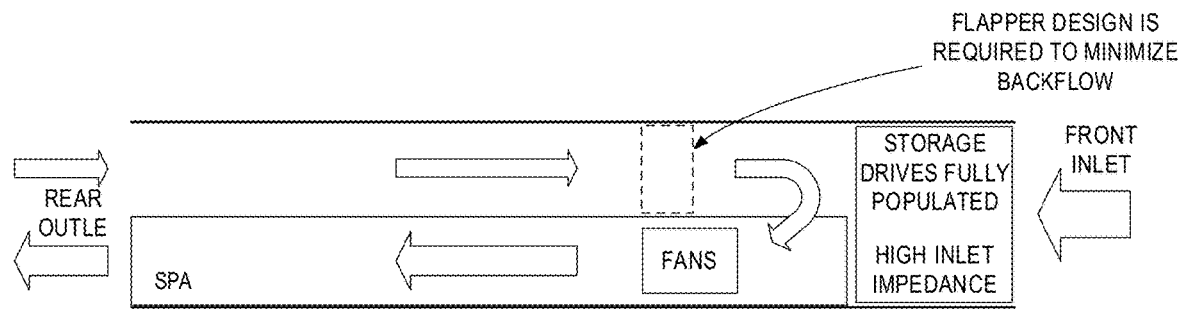

FIGS. 1A and 1B illustrate schematic cross-sectional views of a cooling airflow in a storage server. Referring to FIG. 1A, two storage processors SPA and SPB are arranged in a stacked manner at an airflow rear outlet in a storage server, and the two storage processors SPA and SPB each include fans for guiding the passing airflow. A storage array consisting of storage drives is arranged at an airflow front inlet in the storage server, and the storage drives are fully populated at the airflow front inlet in any known manner and have a high inlet impedance for the airflow.

The cooling airflow enters the storage server from the front inlet and passes through the storage drives, then passes through the storage processors SPA and SPB via the fans of the storage processors SPA and SPB, and exits from the rear outlet. In this case, a direction of normal operation airflow of the cooling airflow in the storage server is from the front inlet to the rear outlet, as indicated by thick right-to-left arrows in FIG. 1A. In this way, the cooling airflow cools the storage array consisting of the storage drives and further cools the storage processors.

The storage server shown in FIG. 1A employs an enclosure having a 2U height, wherein U is a unit height. For example only, 1U may be equal to 44.45 mm. The two storage processors SPA and SPB each have a height corresponding to 1U. In some cases, one storage processor SPB of the two storage processors SPA and SPB is pulled out from the storage server while the other storage server SPA remains in the storage server for maintaining normal operation of the storage server. The pull-out direction of the storage processor SPB is as indicated by the arrow in FIG. 1A.

After the storage processor SPB is pulled out, there is surplus space above the storage processor SPA inside the enclosure of the storage server. The higher the amount of the cooling airflow exiting from the rear outlet, the more likely the discharged cooling airflow will re-enter the interior of the enclosure of the storage server via the rear outlet. The cooling airflow exiting the rear outlet and re-entering the interior of the enclosure via the rear outlet may be referred to as backflow of the cooling airflow. The backflow of the cooling airflow flows from the rear outlet toward the front inlet above the storage processor SPA. When the backflow of the cooling airflow reaches above the end of the storage processor SPA near the storage drive, under the action of the fans of the storage processor SPA, the backflow of the cooling airflow enters the storage processor SPA, flows through the storage processor SPA, and is discharged from the rear outlet, as shown by the thin arrow in FIG. 1B. The above-described flow of the backflow of the cooling airflow inside the enclosure hinders the cooling airflow from entering the inside of the enclosure from the front inlet, so that the amount of the cooling airflow entering from the front inlet is reduced, and thus the amount of the cooling airflow flowing through the storage drives is reduced, thereby reducing the heat dissipation performance of the storage drives and decreasing the performance and life of the storage server.

To prevent the backflow of the cooling airflow into the storage processor SPA and to prevent a reduction in the amount of the cooling airflow flowing through the storage drives, a flapper is disposed over the storage processor SPA as shown in FIG. 1B to minimize the amount of the backflow of the cooling airflow re-entering the interior of the enclosure and ensure that a sufficient amount of cooling airflow flows through the storage drives. As previously mentioned, the height of the enclosure of the storage server shown in FIG. 1B is 2U, the height of the storage processor SPA is 1U, and thus the height of the flapper is approximately 1U. Since the storage processor SPA might also be pulled out, an additional flapper may be further provided at a position corresponding to the storage processor SPA below the flapper shown in FIG. 1B.

Figure 2A:
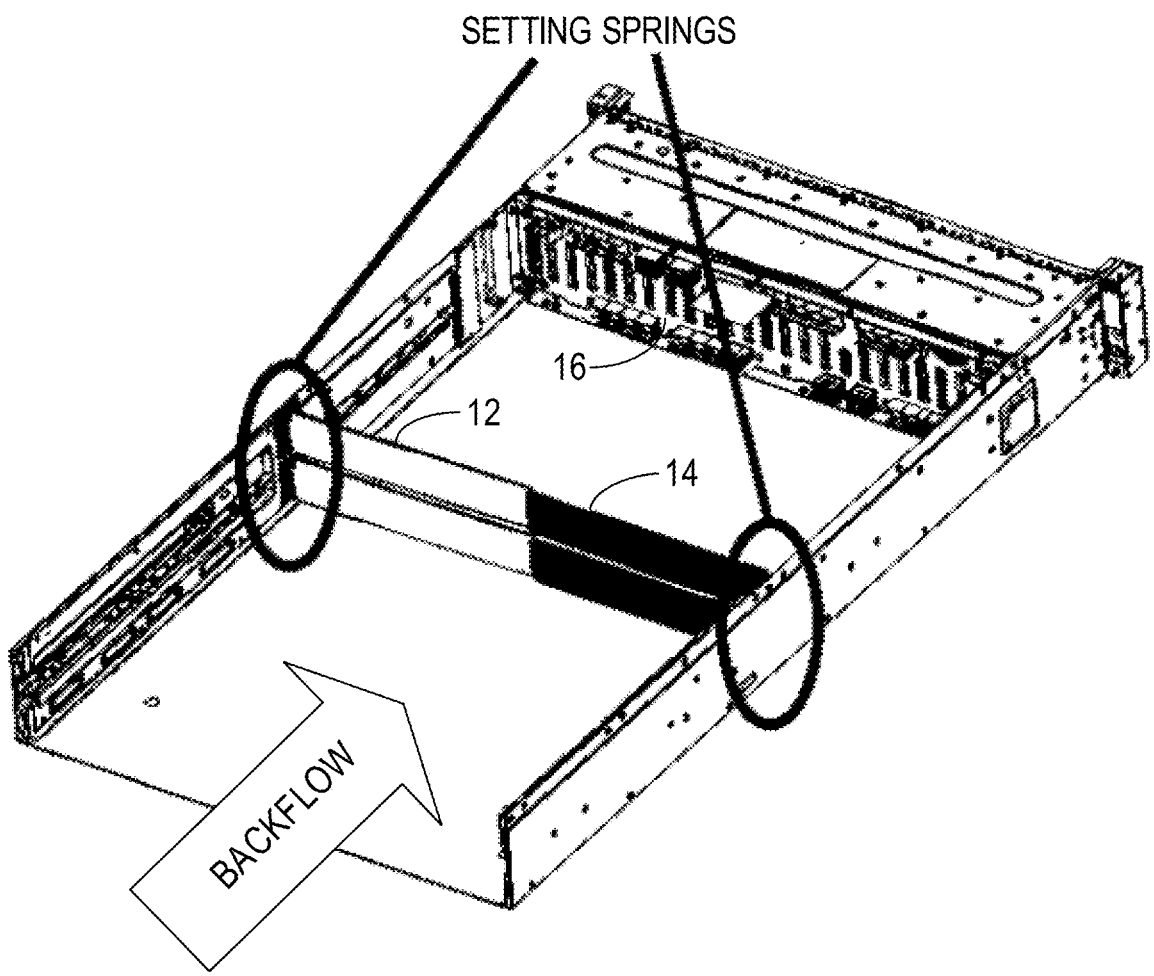
FIGS. 2A and 2B illustrate schematic views of a conventional flapper in a storage server.
Figure 2B:
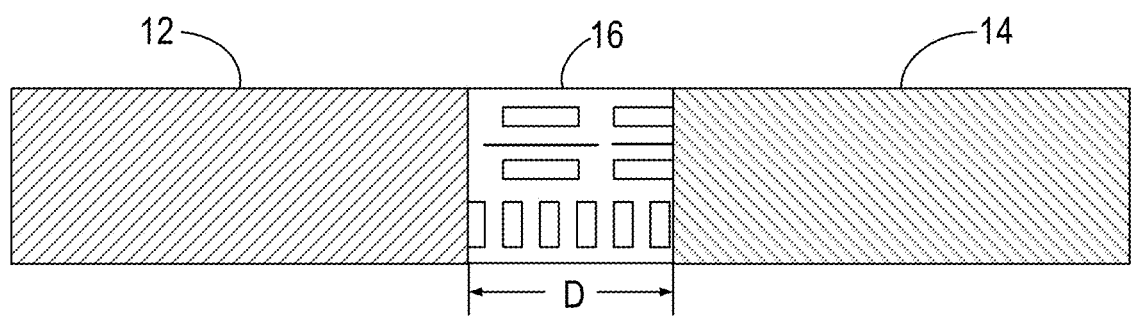

FIGS. 2A and 2B illustrate schematic views of a conventional flapper in a storage server. Referring to FIG. 2A, first and second flappers 12, 14 are coupled to respective sides of the enclosure, respectively. As shown in FIG. 2A, a spring is disposed at a circled coupling portion such that after the storage processor is pulled out, the first and second flappers 12, 14 are rotated by a restoring force to a closed position as shown in FIG. 2A. In a conventional design solution, the first and second flappers 12, 14 return to the closed position as shown in FIG. 2A for blocking backflow of the cooling airflow. In an ideal state, there is no gap between the first flapper 12 and the second flapper 14 in the closed position to minimize backflow of the cooling airflow.

However, as compared with the provided spring, the backflow of the cooling airflow has a longer acting distance to the flapper and thus has a greater leverage effect. Therefore, an acting force exerted by the backflow of the cooling airflow to the flapper may be greater than a maximum holding force of the spring for maintaining the flapper closed, so that the flapper is pushed by the backflow of the cooling airflow away from the closed position as shown in FIG. 2A, so that there is a gap between the first flapper 12 and the second flapper 14. Once there exists the gap, the gap will have a non-negligible or even larger value as the backflow of the cooling airflow acts continuously.

As shown in FIG. 2B, the first and second flappers 12, 14 viewed from the rear inlet are pushed away from the closed position by the backflow of the cooling airflow in a direction from the outside of the paper toward the inside of the paper, so that there is a gap D between an end of the first flapper 12 and a corresponding end of the second flapper 14. The gap D may be up to 10 cm. Through the gap D, an interface portion 16 in the storage server may be observed from the rear outlet. The interface portion 16 is disposed at a position in the interior of the storage server closer to the storage drive than the first and second flappers 12, 14. The Interface portion 16 can be used to interface with a storage processor and/or the storage array. Since there is the gap D in the actual state, the backflow of the cooling airflow will continue to flow towards the interior of the enclosure over the remaining storage processor through the gap D, and enter the storage processor via the fans of the storage processor, as shown in FIGS. 1A and 1B.

In a storage server whose enclosure height is 2U, the flapper design should be completed within a 1U height limit. In the conventional solution as described above, a mechanical latch design with a spring is employed. However, the actual effect of the first and second flappers 12, 14 obstructing the reflow of the cooling airflow is greatly reduced compared to a desired effect, and the heat dissipation performance of the storage drives cannot be significantly improved. In addition, it is challenging to provide additional mating force to the flappers in a given space inside the enclosure.

In view of the above, embodiments of the present disclosure aim to provide an apparatus for housing a storage processor capable of significantly improving the ability to cope with an increasing heat dissipation challenge in a storage server while satisfying a requirement for a minimum space. The apparatus according to an embodiment of the present disclosure includes a pair of magnetic components disposed in end faces or side wall surfaces of a pair of flapper components. The pair of magnetic components provide an additional mating force for coupling the pair of flapper components to each other, to overcome the pushing force exerted by the backflow of the cooling airflow to the flapper components without extra tool support, and effectively prevent the backflow of the cooling airflow from entering the interior of the enclosure of the storage server. In this way, a sufficient flow of cooling airflow flows through the storage drives in the storage server is ensured while significantly improving the heat dissipation performance of the storage drives.

Hereinafter, the apparatus for housing the storage processor according to embodiments of the present disclosure will be described in detail.

Figure 3:
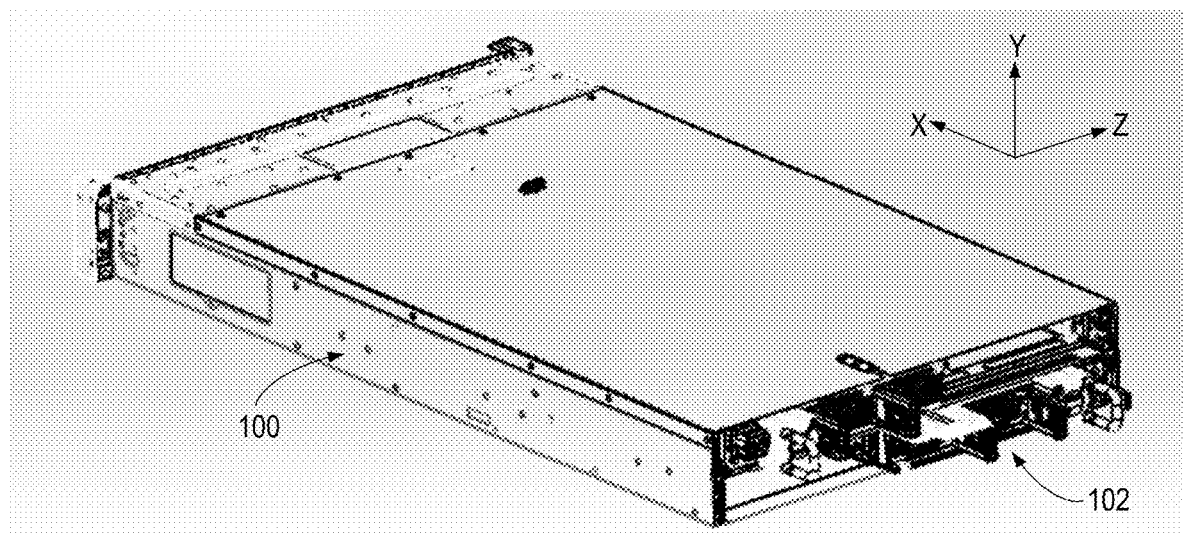
FIG. 3 illustrates a schematic diagram of an apparatus for housing a storage processor in accordance with an embodiment of the present disclosure.

FIG. 3 illustrates a schematic diagram of an apparatus for housing a storage processor in accordance with an embodiment of the present disclosure. Referring to FIG. 3, the apparatus 100 is configured as the housing for receiving the storage processor 102. In some embodiments, the apparatus 100 has a length in a first direction X, a height in a second direction Y, and a width in a third direction Z. The second direction Y is orthogonal to the first direction X, and the third direction Z is orthogonal to the first direction X and the second direction Y. The storage processor 102 is inserted into the apparatus 100.

In some embodiments, the storage server may include the storage processor 102 and a storage array electrically coupled to the storage processor 102, the storage array being comprised of storage drives such as hard drives and solid state drives. In some embodiments, the apparatus 100 may be part of an enclosure of the storage server to house the storage processor 102 that is inserted into the storage server and facilitate the removal of the storage processor 102 from the storage server. In some embodiments, the height of the apparatus 100 may be 2U to adapt for the storage server that is 2U in height. For example only, 1U may be equal to 44.45 mm. In some embodiments, the apparatus 100 is adapted to house two storage processors 102 stacked on one another. In some embodiments, in some cases, one of the storage processors 102 is pulled out from the apparatus 100 and the other storage processor 102 remains in the apparatus 100 to maintain normal operation of the storage server.

Figure 4:
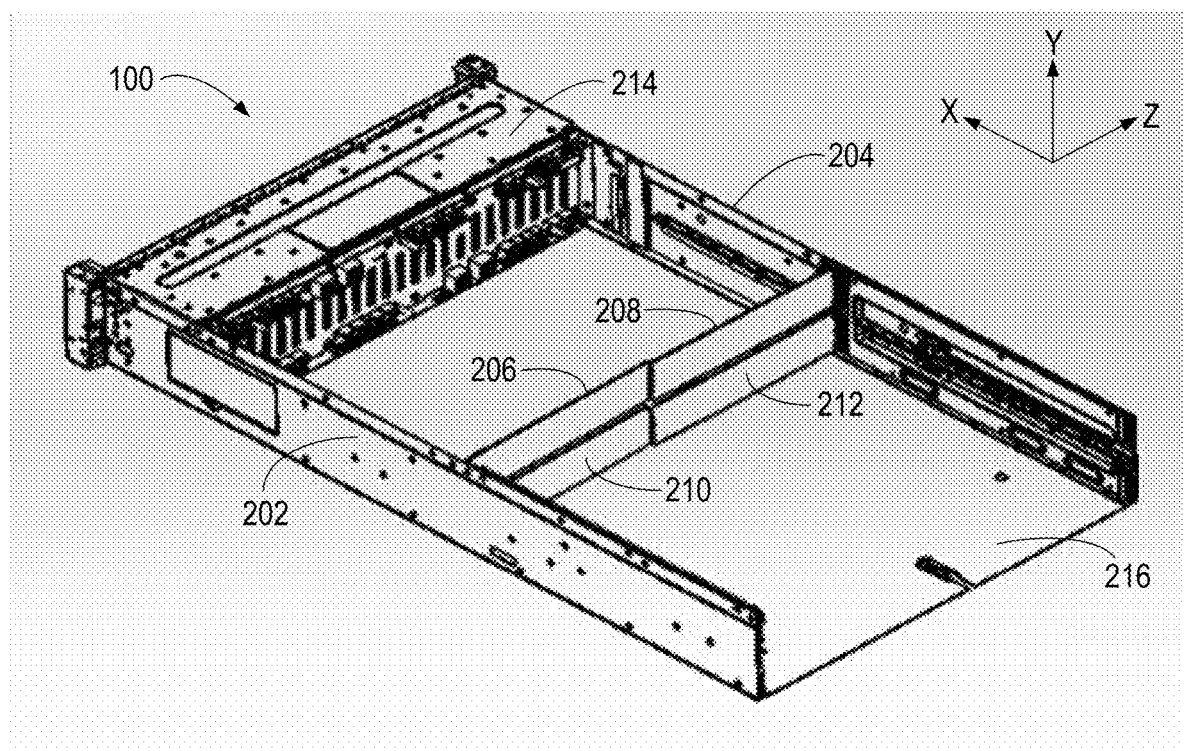
FIG. 4 illustrates a schematic diagram of an apparatus for housing a storage processor in accordance with an embodiment of the present disclosure.

FIG. 4 illustrates a schematic diagram of an apparatus for housing a storage processor in accordance with an embodiment of the present disclosure. In the example shown in FIG. 4, the apparatus 100 does not have the storage processor inserted therein. Referring to FIG. 4, the apparatus 100 includes a first side portion 202 and a second side portion 204, a first flapper component 206, and a second flapper component 208.

The first and second side portions 202, 204 each extend in a plane defined by the first direction X and the second direction Y orthogonal to the first direction X. In some embodiments, the first and second side portions 202, 204 each have a length in the first direction X and a height in the second direction Y. In some embodiments, the first and second side portions 202, 204 each have a width in the third direction Z that is orthogonal to the first direction X and the second direction Y. Further, the first and second side portions 202, 204 are separated from each other along the third direction Z. In some embodiments, the first and second side portions 202, 204 are arranged in parallel with each other to house the storage processor. In some embodiments, a distance between the first side portion 202 and the second side portion 204 apart from each other along the third direction Z corresponds to a width of the storage processor in the third direction Z.

The first and second flapper components 206, 208 are disposed between the first side portion 202 and the second side portion 204, and are coupled to the first side portion 202 and the second side portion 204, respectively. The first flapper component 206 extends in a first plane that is parallel to the second direction Y, and the second flapper component 208 extends in a second plane that is parallel to the second direction Y. In some embodiments, the first flapper component 206 has a length in a direction perpendicular to the second direction Y in the first plane and has a height in the second direction Y, and the second flapper component 208 has a length in a direction perpendicular to the second direction Y in the second plane and has a height in the second direction Y. In some embodiments, the first flapper component 206 has a width in a direction perpendicular to the first plane, and the second flapper component 208 has a width in a direction perpendicular to the second plane. In this way, the shapes of the first and second flapper components 206, 208 are designed such that the backflow of the cooling airflow in the first direction X can be blocked.

The first flapper component 206 is rotatable about a first axis, and the second flapper component 208 is rotatable about a second axis, the first axis and the second axis are parallel to the second direction Y. In some embodiments, one end of the first flapper component 206 in the lengthwise direction is rotatably coupled to the first side portion 202, and an end of the second flapper component 208 in the lengthwise direction is rotatably coupled to the second side 204. In this way, the first and second flapper components 206, 208 may be positioned in two states, such as an open state and a closed state, after the storage processor 102 is inserted into or pulled out from the apparatus 100.

The first flapper component 206 has a first end face in a plane perpendicular to the first plane. The second flapper component 208 has a second end face in a plane perpendicular to the second plane. In some embodiments, the plane in which the first end face lies is perpendicular to the first plane and parallel to the second direction Y, and the plane in which the second end face lies is perpendicular to the second plane and parallel to the second direction Y. In the example shown in FIG. 4, the first and second flapper components 206, 208 are in the closed state. In the closed state, the first end face is coupled to the second end face, and the first plane and the second plane are coplanar. In some embodiments, the first and second side portions 202, 204 are separated from each other by a predetermined distance along the third direction Z, and respective lengths of the first and second flapper components 206, 208 in the closed state in the third direction Z are half of the predetermined distance. In this way, in the closed state, there may not be a gap between the first flapper component 206 and the second flapper component 208, so that the backflow of the cooling airflow along the first direction X can be completely blocked.

In some embodiments, the heights of the first and second flapper components 206, 208 in the second direction Y correspond to the height of the storage processor 102.

Referring to FIG. 4, in some embodiments, the apparatus 100 may further include a third flapper component 210 and a fourth flapper component 212. The third and fourth flapper components 210, 212 are disposed between the first side portion 202 and the second side portion 204, and are coupled to the first side portion 202 and the second side portion 204, respectively. The third and fourth flapper components 210, 212 are disposed adjacent to the first flapper component 206 and the second flapper component 208 in the second direction Y, respectively. The third flapper component 210 extends in a third plane parallel to the second direction Y, and the fourth flapper component 212 extends in a fourth plane parallel to the second direction Y. In some embodiments, the third flapper component 210 has a length in a direction perpendicular to the second direction Y in the third plane and has a height in the second direction Y, and the fourth flapper component 212 has a length in a direction perpendicular to the second direction Y in the fourth plane and has a height in the second direction Y. In some embodiments, the third flapper component 210 has a width in a direction perpendicular to the third plane, and the fourth flapper component 212 has a width in a direction perpendicular to the fourth plane. In this way, the shapes of the third and fourth flapper components 210, 212 are designed such that the backflow of the cooling airflow in the first direction X can be blocked.

The third flapper component 210 is rotatable about the first axis and the fourth flapper component 212 is rotatable about the second axis. In some embodiments, one end of the third flapper component 210 in the lengthwise direction is rotatably coupled to the first side portion 202, and an end of the fourth flapper component 212 in the lengthwise direction is rotatably coupled to the second side portion 204. In this way, the third and fourth flapper components 210, 212 may be positioned in two states, such as the open state and the closed stage, after the storage processor 102 is inserted into or pulled out from the apparatus 100.

The third flapper component 210 has a third end face in a plane perpendicular to the third plane. The fourth flapper component 212 has a fourth end face in a plane perpendicular to the fourth plane. In some embodiments, the plane in which the third end face lies is perpendicular to the third plane and parallel to the second direction Y, and the plane in which the fourth end face lies is perpendicular to the fourth plane and parallel to the second direction Y. In the example shown in FIG. 4, the third and fourth flapper components 210, 212 are in the closed state. In the closed state, the third end face is coupled to the fourth end face, and the third plane and the fourth plane are coplanar. In some embodiments, respective lengths of the third and fourth flapper components 210, 212 in the third direction Z are half of a predetermined distance between the first side portion 202 and the second side portion 204. In this way, in the closed state, there may not be a gap between the third flapper component 210 and the fourth flapper component 212, so that the backflow of the cooling airflow in the first direction X can be completely blocked.

In some embodiments, the heights of the third and fourth flapper components 210, 212 in the second direction Y correspond to the height of the storage processor 102.

In some embodiments, the heights of the first and second flapper components 206, 208 in the second direction Y are equal to those of the third and fourth flapper components 210, 212 in the second direction Y. In some embodiments, the heights of the first and second side portions 202, 204 in the second direction Y are twice those of the first and second flapper components 206, 208 in the second direction Y. In this way, the apparatus 100 may be adapted for a solution of a typical 2U-height storage server.

Referring to FIG. 4, in some embodiments, the apparatus 100 may further include an interface component 214 that is configured to be electrically coupled to the storage processor 102. In some embodiments, the interface component 214 is coupled to the first and second side portions 202, 204. In some embodiments, the interface component 214 is further configured to be electrically coupled to the storage array comprised of storage drives.

Referring to FIG. 4, in some embodiments, the apparatus 100 may further include a bottom portion 216. In some embodiments, the bottom portion 216 extends in a plane defined by the first direction X and the third direction Z. In some embodiments, the plane in which the bottom portion 216 is located is perpendicular to the first plane, the second plane, the third plane and the fourth plane, respectively. It should be understood that the apparatus may further include a top portion that is not shown in FIG. 4. In some embodiments, the top portion extends in a plane defined by the first direction X and the third direction Z, is separated from the bottom portion 216 in the second direction Y, and is coupled to the first side portion 202 and the second side portion 204.

Figure 5A:
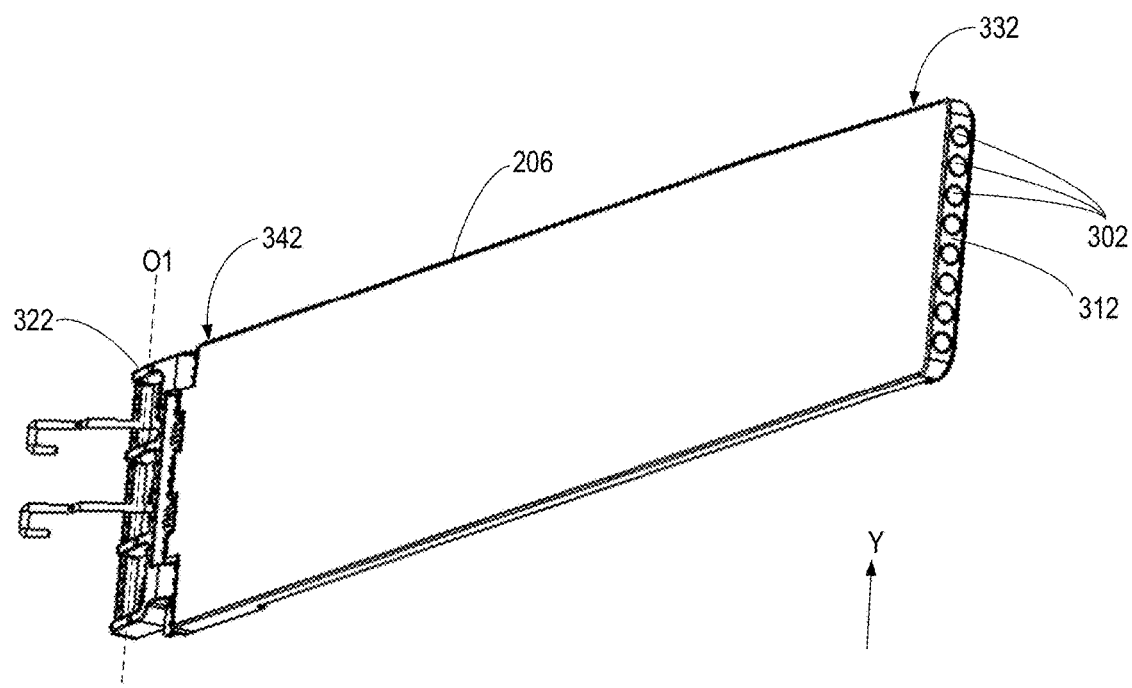
FIGS. 5A-5D illustrate schematic views of an arrangement of a flapper component, a magnetic component and a spring component according to an embodiment of the present disclosure.
Figure 5B:
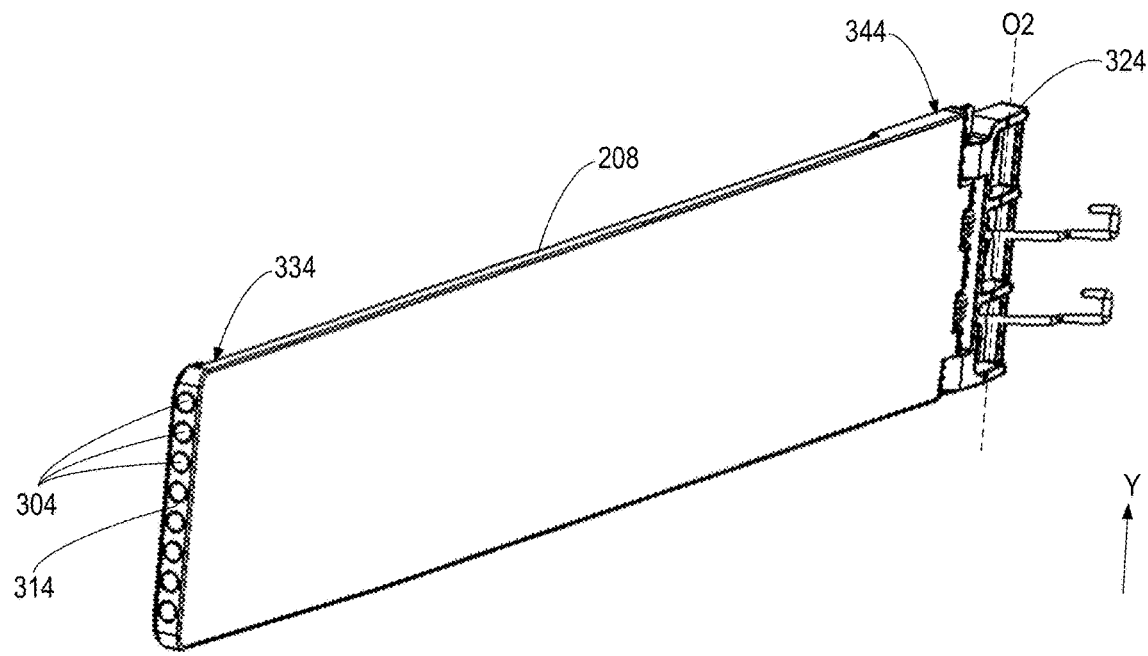

FIGS. 5A-5D illustrate schematic views of an arrangement of a flapper component, a magnetic component and a spring component according to an embodiment of the present disclosure. Referring to FIGS. 5A and 5B, the apparatus 100 further includes a first magnetic component 302 and a second magnetic component 304.

The first and second magnetic components 302, 304 are disposed in a first end face 312 of the first flapper component 206 and a second end face 314 of the second flapper component 208, respectively. The first and second magnetic components 302, 304 are configured to be coupled to each other by a magnetic force to thereby couple the first end face 312 to the second end face 314. In some embodiments, the first end face 312 is a surface of the sidewall of the first flapper component 206, and the second end face 314 is a surface of the sidewall of the second flapper component 208.

In some embodiments, the first and second magnetic components 302, 304 are further configured such that the first flapper component 206 and the second flapper component 208 are coupled in a manner of being positioned in parallel with the third direction Z. In some embodiments, in the closed state shown in FIG. 4, the first and second magnetic components 302, 304 are configured to be coupled to each other by magnetic force in order to couple the first end face 312 and the second end face 314, such that the first flapper component 206 and the second flapper component 208 are coupled in a manner of being positioned in parallel with the third direction Z. In some embodiments, the first magnetic component 302 has a first magnetic pole, and the second magnetic component 304 has a second magnetic pole opposite to the first magnetic pole. In this way, after the storage processor 102 is pulled out from the apparatus 100, the first and second magnetic components 302, 304 couple the first end face 312 of the first flapper component 206 to the second end face 314 of the second flapper component 208. As such, there is no gap between the first flapper component 206 and the second flapper component 208 in the closed state as shown in FIG. 4. As a result, the backflow of the cooling airflow is blocked while the performance of heat dissipation can be improved.

In some embodiments, the first and second magnetic components 302, 304 are further configured to decouple from each other when a pushing force applied to the first and second flapper components 206, 208 is greater than a predetermined threshold. In some embodiments, the first and second magnetic components 302, 304 are further configured to decouple from each other under the action of the pushing force, such that the first and second flapper components 206, 208 are decoupled from each other and are rotatable about the first axis 01 and the second axis 02 toward the direction of the pushing force, respectively.

In some embodiments, the pushing force is applied to the first and second flapper components 206, 208 via the storage processor 102 to be inserted into the apparatus 100. In some embodiments, the first and second magnetic components 302, 304 are further configured to remain coupled to each other when the pushing force applied to the first and second flapper components 206, 208 is less than a predetermined threshold. In some embodiments, the threshold is greater than the pushing force of the backflow of the cooling airflow acting on the first and second flapper components 206, 208. In this way, when the storage processor 102 is inserted into the apparatus 100, the pushing force decouples the first end face 312 of the first flapper component 206 from the second end face 314 of the second flapper component 208, such that the first and second flapper components 206, 208 are rotated toward the open state to house the storage processor 102, which will be discussed below. Furthermore, even in the case where the backflow of the cooling airflow acts on the first and second flapper components 206, 208, the first and second magnetic components 302, 304 keep coupling the first end face 312 and the second end face 314, to prevent a gap from occurring between the first flapper component 206 and the second flapper component 208.

In some embodiments, the first flapper component 206 includes a first end 332 and a second end 342 opposite to the first end 332, the first end 332 has the first end face 312, and the first flapper component 206 is coupled to the first side portion 202 via the second end 342. In some embodiments, the second flapper component 208 includes a third end 334 and a fourth end 344 opposite to the third end 334, the third end 334 has the second end face 314, and the second flapper component 208 is coupled to second side portion 204 via the fourth end 344.

Referring to FIGS. 5A and 5B, in some embodiments, the apparatus 100 further includes a first spring component 322 and a second spring component 324. The first and second spring components 322, 324 are configured to couple the second end 342 of the first flapper component 206 and the fourth end 344 of the second flapper component 208 to the first side portion 202 and the second side portion 204, respectively, and configured to enable the first and second flapper components 206, 208 to be rotatable about the first axis 01 and the second axis 02, respectively. In some embodiments, the first axis 01 and the second axis 02 are parallel to the second direction Y.

Figure 5C:
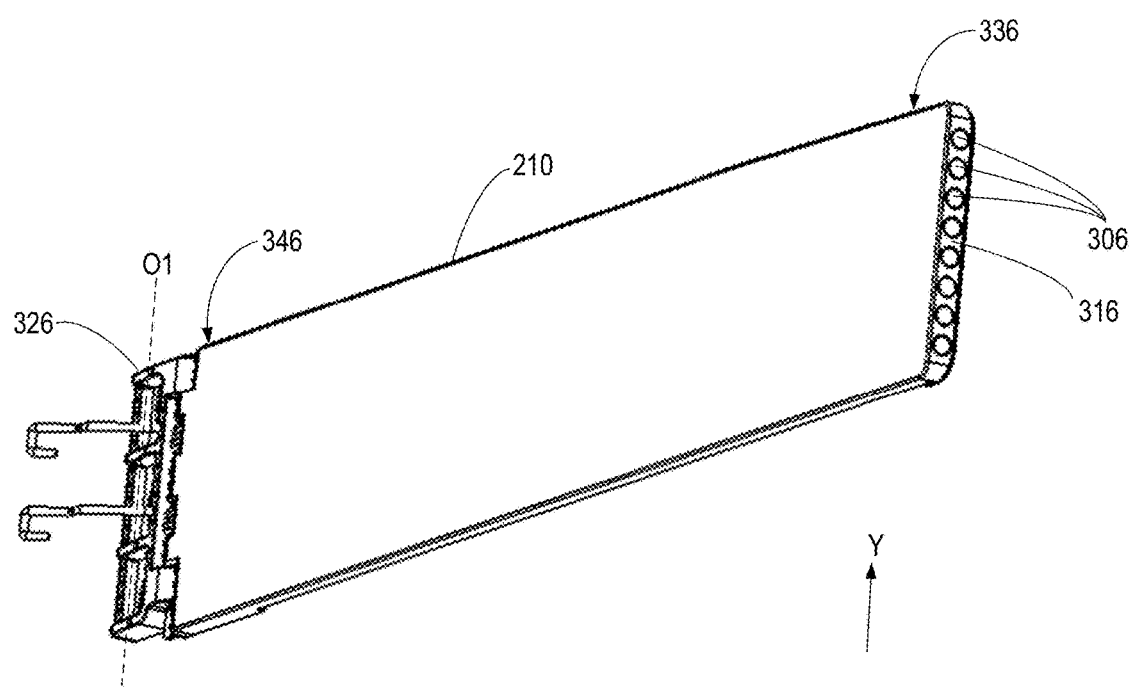
Figure 5D:
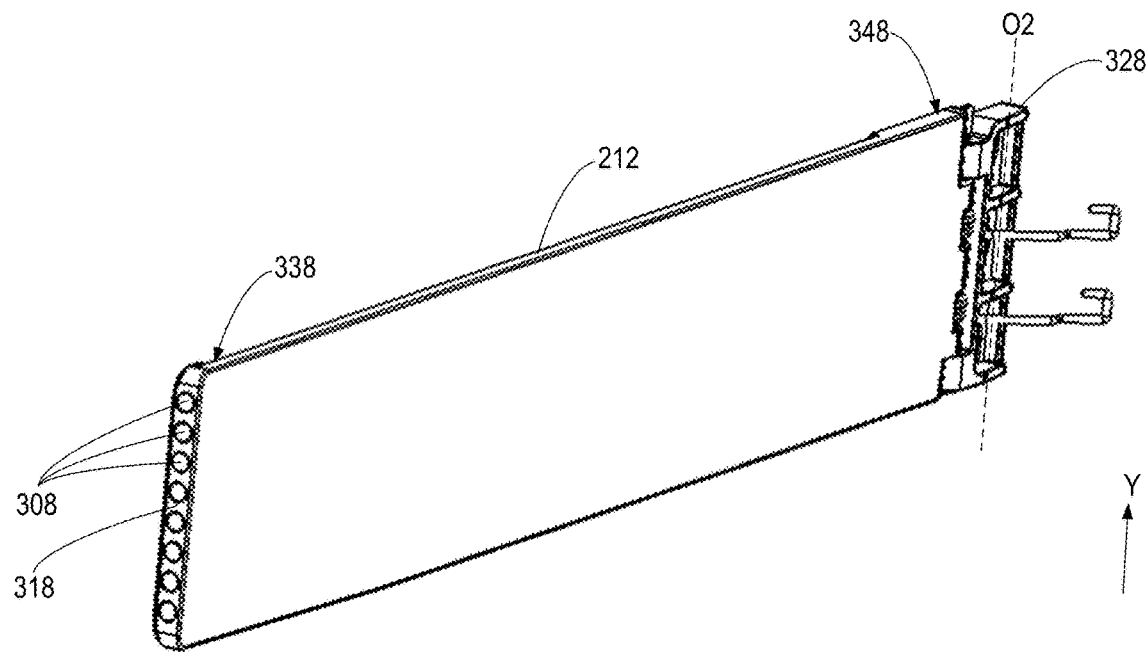

Referring to FIGS. 5C and 5D, in some embodiments, the apparatus 100 further includes a third magnetic component 306 and a fourth magnetic component 308. The third and fourth magnetic components 306, 308 are disposed in a third end face 316 of the third flapper component 210 and a fourth end face 318 of the fourth flapper component 212, respectively. The third and fourth magnetic components 306, 308 are configured to be coupled to each other by a magnetic force so as to couple the third end face 316 to the fourth end face 318. In some embodiments, the third end face 316 is a surface of the sidewall of the third flapper component 210, and the fourth end face 318 is a surface of the sidewall of the fourth flapper component 212.

In some embodiments, the third and fourth magnetic components 306, 308 are further configured such that the third flapper component 210 and the fourth flapper component 212 are coupled in a manner of being positioned in parallel with the third direction Z. In some embodiments, in the closed state shown in FIG. 4, the third and fourth magnetic components 306, 308 are configured to be coupled to each other by a magnetic force in order to couple the third end face 316 and the fourth end face 318, such that the third flapper component 210 and the fourth flapper component 212 are coupled in a manner of being positioned in parallel with the third direction Z. In some embodiments, the third magnetic component 306 has a first magnetic pole and the fourth magnetic component 308 has a second magnetic pole opposite to the first magnetic pole. In this way, as described above, in the closed state shown in FIG. 4, there is no gap between the third flapper component 210 and the fourth flapper component 212, thereby blocking the backflow of the cooling airflow, and improving the heat dissipation performance.

In some embodiments, the third and fourth magnetic components 306, 308 are further configured to decouple from each other when the pushing force applied to the third and fourth flapper components 210, 212 is greater than a predetermined threshold. In some embodiments, the third and fourth magnetic components 306, 308 are further configured to decouple from each other under the action of the pushing force, such that the third and fourth flapper components 210, 212 decouple from each other, and are rotatable about the first axis 01 and the second axis 02 toward the direction of the pushing force, respectively.

In some embodiments, the pushing force is applied to the third and fourth flapper components 210, 212 via the storage processor 102 to be inserted into the apparatus 100. In some embodiments, the third and fourth magnetic components 306, 308 are further configured to remain coupled to each other when the pushing force applied to the third and fourth flapper components 210, 212 is less than a predetermined threshold. In some embodiments, the threshold is greater than the pushing force of the backflow of the cooling airflow acting on the third and fourth flapper components 210, 212. In this way, as previously described, the pushing force causes the third and fourth flapper components 210, 212 to rotate toward the open state (which will be described later) to house the storage processor 102, and prevent a gap from existing between the third flapper component 210 and the fourth flapper component 212 even in the case that the backflow of the cooling airflow acts on the third and fourth flapper components 210, 212.

In some embodiments, the third flapper component 210 includes a fifth end 336 and a sixth end 346 opposite to the fifth end 336, the fifth end 336 has a third end face 316, and the third flapper component 210 is coupled to the first side portion 202 via the sixth end 346. In some embodiments, the fourth flapper component 212 includes a seventh end 338 and an eighth end 348 opposite to the seventh end 338, the seventh end 338 has a fourth end face 318, and the fourth flapper component 212 is coupled to second side portion 204 via the eighth end 348.

Referring to FIGS. 5C and 5D, in some embodiments, the apparatus 100 further includes a third spring component 326 and a fourth spring component 328. The third and fourth spring components 326, 328 are configured to couple the sixth end 346 of the third flapper component 210 and the eighth end 348 of the fourth flapper component 212 to the first side portion 202 and the second side portions 204, respectively, and configured to enable the third and fourth flapper components 210, 212 to be rotatable about the first axis 01 and the second axis 02, respectively.

Figure 6A:
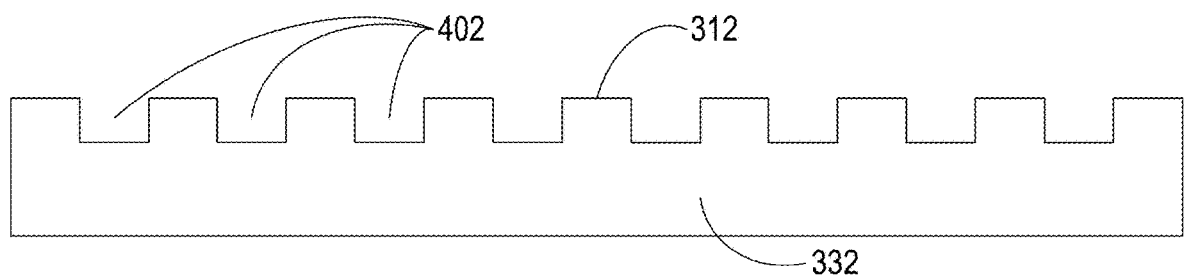
FIGS. 6A-6D illustrate schematic views of an arrangement of a magnetic component according to an embodiment of the present disclosure.
Figure 6B:
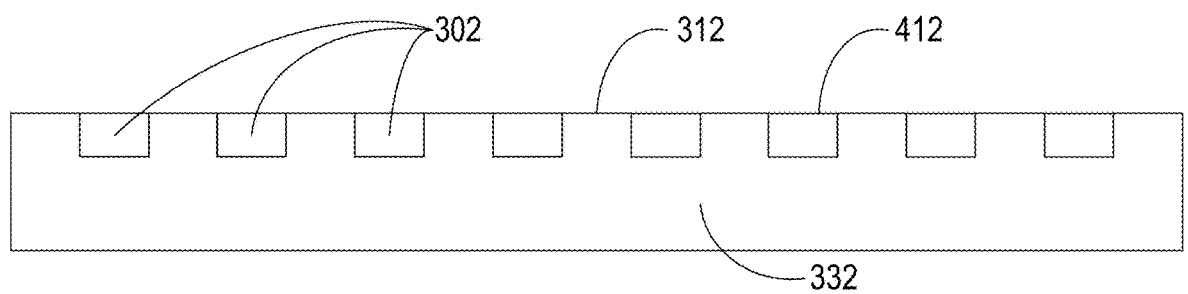
Figure 6C:
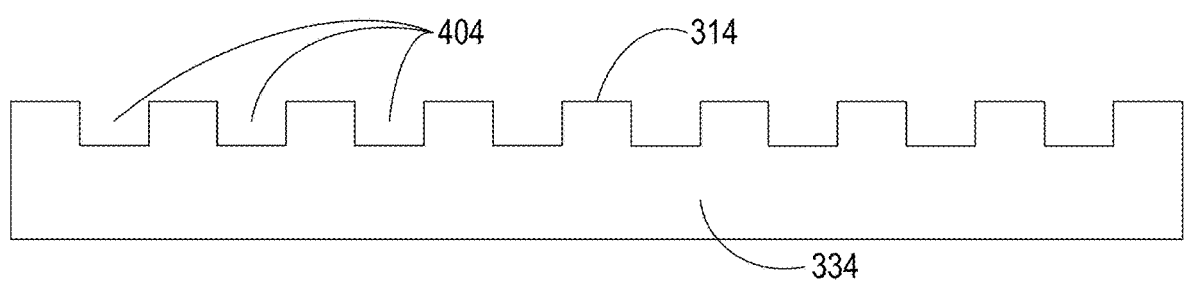

FIGS. 6A-6D illustrate schematic views of an arrangement of magnetic components according to an embodiment of the present disclosure. Referring to FIGS. 6A and 6C, in some embodiments, the first end 332 of the first flapper component 206 includes first recesses 402 disposed in the first end face 312 to be adapted to house the first magnetic components 302, and the third end 334 of the second flapper component 208 includes second recesses 404 disposed in the second end face 314 to be adapted to house the second magnetic components 304.

Figure 6D:
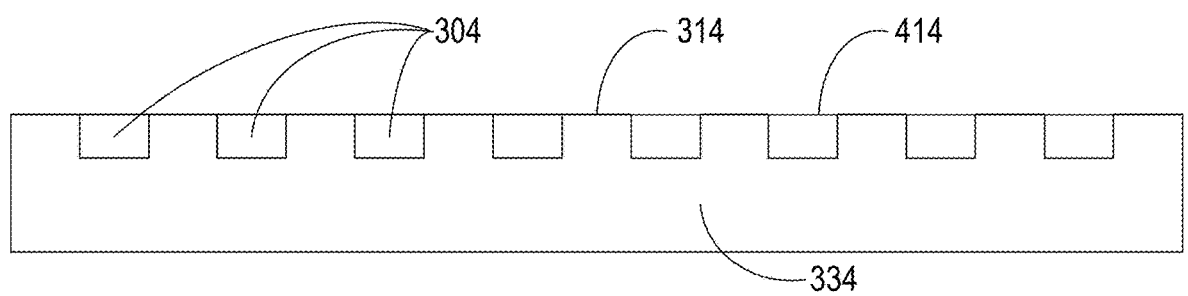

Referring to FIGS. 6B and 6D, in some embodiments, the first magnetic components 302 are disposed in the first recesses 402 to be embedded in the first end face 312 of the first flapper component 206, and the second magnetic components 304 are disposed in the second recesses 404 to be embedded in the second end face 314 of the second flapper component 334. In some embodiments, a top surface 412 of the first magnetic component 302 is coplanar with the first end face 312, and a top surface 414 of the second magnetic component 304 is coplanar with the second end face 314. In this way, the first end face 312 may be coupled to the second end face 314 in a face-to-face manner such that there is no gap between the first end face 312 and the second end face 314 to ensure that the backflow of the cooling airflow is substantially completely blocked.

In some embodiments, at least one first recess 402 is disposed in the first end face 312, and at least one first magnetic component 302 is disposed in the at least one first recess 402, respectively. In some embodiments, at least one second recess 404 is disposed in the second end face 314, and at least one second magnetic component 304 is disposed in the at least one second recess 404, respectively. Referring to FIGS. 5A and 5B, at least one first magnetic component 302 and at least one second magnetic component 304 are respectively arranged in the first end face 312 and the second end face 314 in the second direction Y.

The apparatus according to the embodiments of the present disclosure employs a magnetic force holding design and includes magnetic components embedded in end faces of the ends or surfaces of the sidewalls of the flapper components. The magnetic components are configured to couple the rotatable flapper components by a magnetic force when the storage processor is pulled out from the enclosure of the storage server, and configured to cause the flapper components to rotate to an open state without extra tools when the storage processor is inserted into the enclosure. By the latching mechanism design of the magnetic components in the apparatus according to the embodiments of the present disclosure, the gap between the flapper components in the closed state is substantially avoided. In the case where a storage processor is pulled out from the storage server, the cooling airflow flowing through the storage drives is significantly increased (e.g., at least 30%) compared to conventional solutions, thereby improving the heat dissipation performance of the storage drives, and thereby allowing the operating temperature of the storage drives to rise (e.g., about 9° C.) such that the storage server operates at a higher ambient temperature (e.g., 40° C.).

It should be understood that although FIGS. 5A and 5B, 6B, and 6D illustrate eight first magnetic components 302 and eight second magnetic components 304, the apparatus 100 may include other number of first magnetic components 302 and second magnetic components 304 in other embodiments. Further, although FIGS. 5A and 5B, 6B, and 6D show that the first magnetic components 302 and the second magnetic components 304 are arranged in one row, the first magnetic components 302 and the second magnetic components 304 may be arranged in other number of rows in other embodiments.

In addition, the arrangement of the third magnetic components 306 in the third end face 316 and the arrangement of the fourth magnetic components 308 in the fourth end face 318 may be respectively the same as the arrangement of the first magnetic components 302 in the first end face 312 and the arrangement of the second magnetic components 304 in the second end face 314, and thus will not be described in detailed any more.

In some embodiments, the magnetic components according to embodiments of the present disclosure may have a cylindrical shape. For example, the shape may have a diameter of about 2.4 mm and a height of about 2 mm. It should be understood that the magnetic components according to embodiments of the present disclosure may have any other suitable shape and size. In some embodiments, the magnetic components according to embodiments of the present disclosure may include neodymium iron boron magnetic material. In some embodiments, the magnetic components according to embodiments of the present disclosure may include N38 magnetic material. It should be understood that the magnetic components according to embodiments of the present disclosure may include any other suitable magnetic materials that provide a magnetic force.

Figure 7:
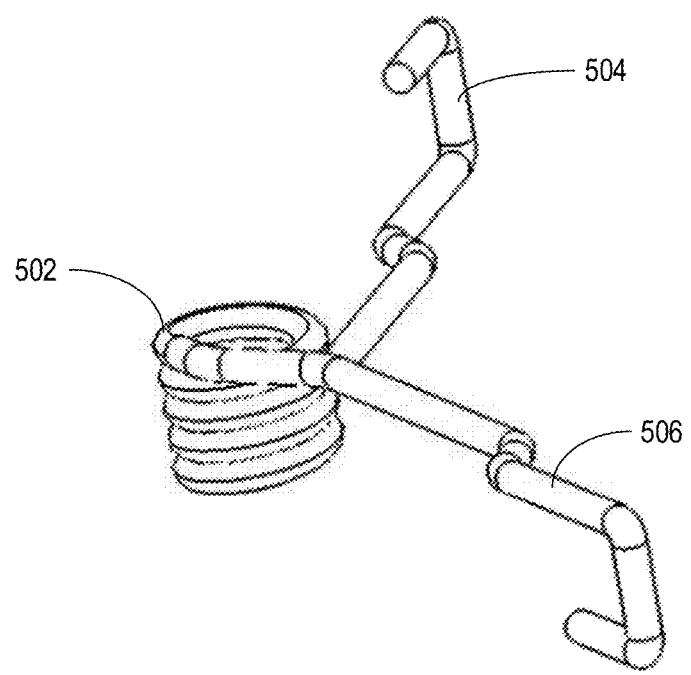
FIG. 7 illustrates a schematic view of a spring component in accordance with an embodiment of the present disclosure.

FIG. 7 illustrates a schematic view of a spring component in accordance with an embodiment of the present disclosure. Referring to FIG. 7, in some embodiments, each of the previously-described first spring component 322, second spring component 324, third spring component 326 and fourth spring component 328 includes a spring body 502, a first extension 504 and a second extension 506.

The first extension 504 extends from one end of the spring body 502 and is coupled to one of the first and second side portions 202, 204. The second extension 506 extends from an opposite end of the spring body 502 and is coupled to a corresponding one of the first and second flapper components 206, 208. In some embodiments, the first and second extensions 504, 506 are angled to provide a spring restoring force.

In some embodiments, the first and second spring components 322, 324 are configured to respectively provide the restoring force to the first and second flapper components 206, 208 while the storage processor 102 is pulled out from the apparatus 100, so that the first and second flapper components 206, 208 rotate in the pull-out direction. In some embodiments, a moment of the spring component is designed to match the mass and size of the flapper components such that the first and second flapper components 206, 208 are rotated by the restoring force to a proper position in the pull-out direction, to allow the first and second magnetic components 302, 304 to be coupled to each other by the magnetic force.

It should be understood that the spring components of the embodiments of the present disclosure are not limited to the spring components illustrated in FIG. 7, and the apparatus 100 may employ other types of components which are known in the art and capable of providing the restoring force.

Figure 8:
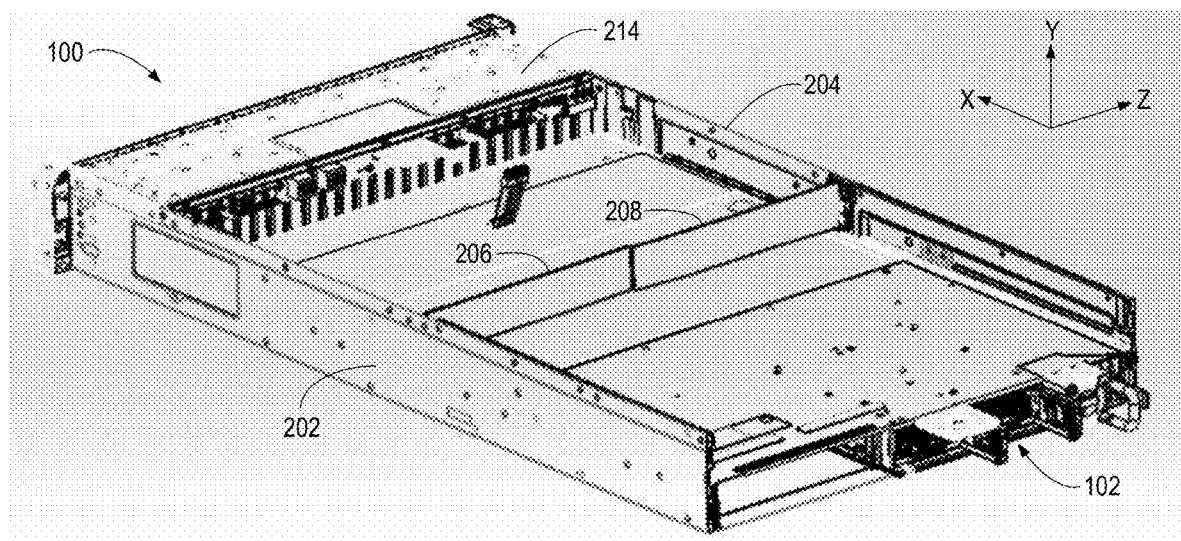
FIG. 8 illustrates a schematic view of a closed state of flapper components according to an embodiment of the present disclosure.

FIG. 8 illustrates a schematic view of a closed state of flapper components according to an embodiment of the present disclosure. Referring to FIG. 8, one storage processor 102 is housed in the apparatus 100, there is no other storage processor above the storage processor 102, and the first and second flapper components 206, 208 are in a closed state. In the closed state, the first and second flapper components 206, 208 are positioned in parallel with the third direction Z by the coupling of the first magnetic component 302 and the second magnetic component 304. In the closed state according to an embodiment of the present disclosure, there is no gap between the first flapper component 206 and the second flapper component 208.

Figure 9:
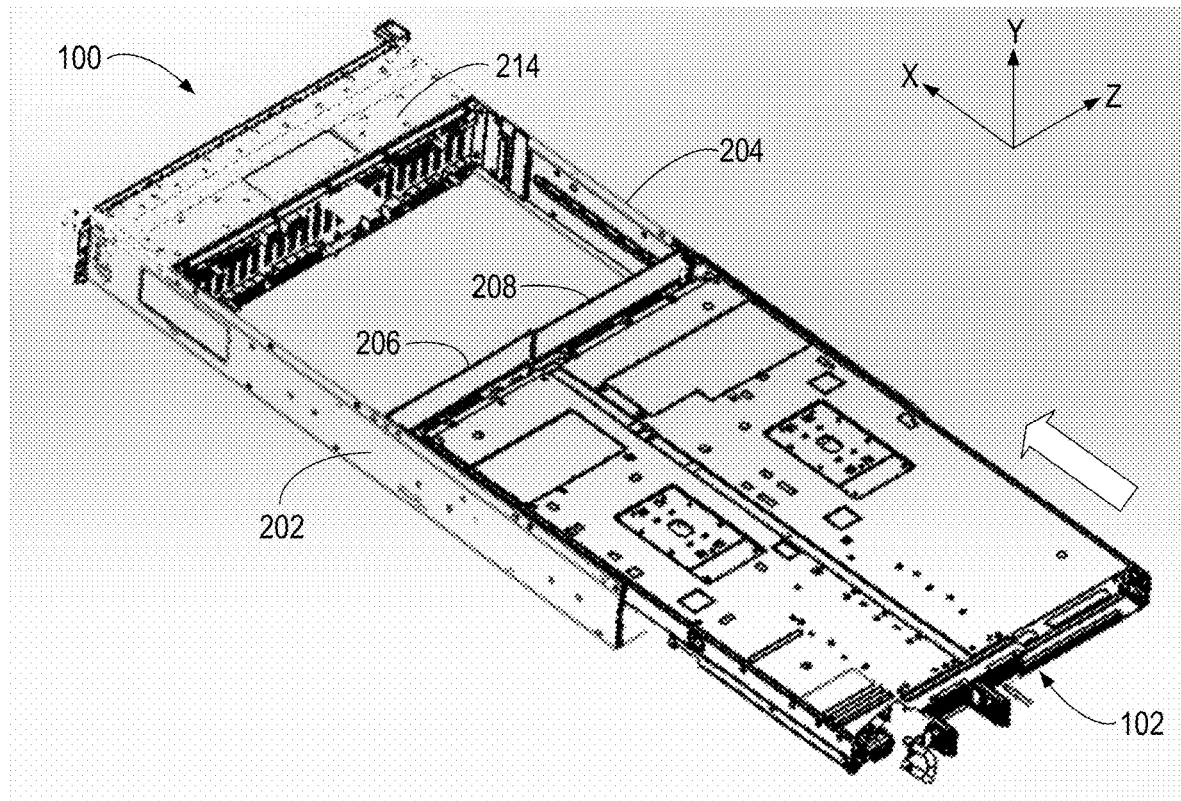
FIG. 9 illustrates a schematic diagram of inserting a storage processor in accordance with an embodiment of the present disclosure.

FIG. 9 illustrates a schematic diagram of inserting a storage processor in accordance with an embodiment of the present disclosure. Referring to FIG. 9, the storage processor 102 is inserted into the apparatus 100 in the first direction X, as indicated by the arrow. During insertion of the storage processor 102 into the apparatus 100 in the first direction X by an external force, the external force is applied to the first and second flapper components 206, 208 via the storage processor 102 such that the first and second magnetic components 302, 304 decouple from each other. In some embodiments, during insertion of the storage processor 102, the first and second flapper components 206, 208 are adapted to rotate in the first direction X to an open state under the action of the external force.

Figure 10:
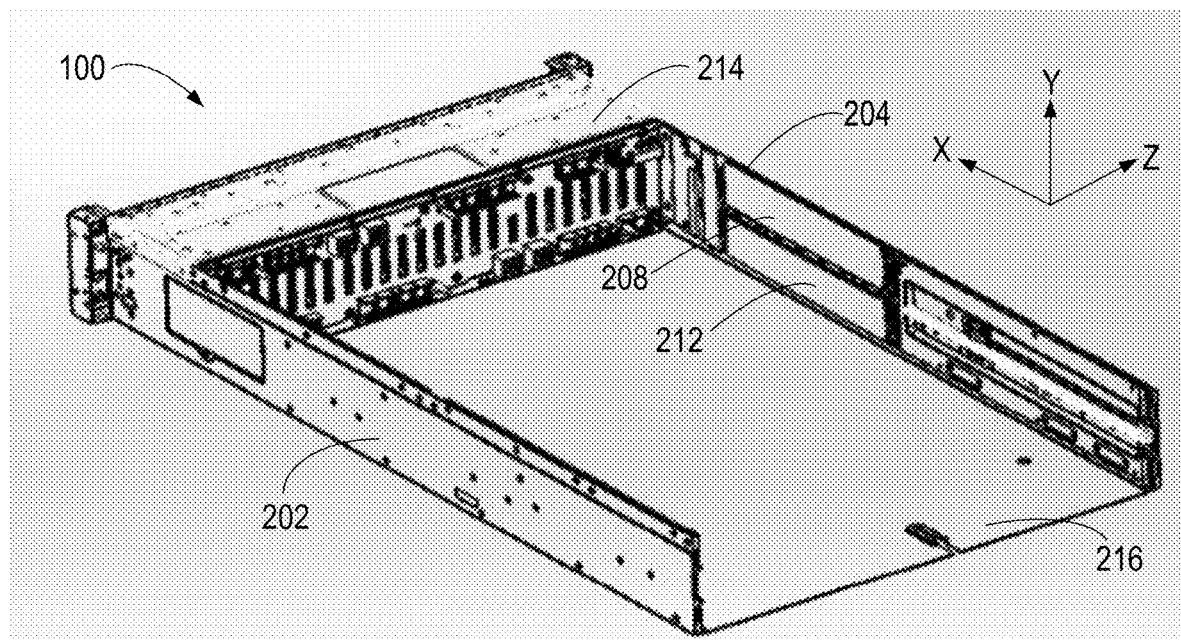
FIG. 10 shows a schematic view of an open state of flapper components according to an embodiment of the present disclosure.

FIG. 10 shows a schematic view of an open state of flapper components according to an embodiment of the present disclosure. For convenience of explanation, two storage processors 102 that have been inserted into the apparatus 100 are omitted in FIG. 10. In the open state, the first and second flapper components 206, 208 are positioned substantially parallel to the first direction X. In some embodiments, the first plane of the first flapper component 206 and the second plane of the second flapper component 208 are respectively adjacent to and substantially parallel to the plane of the first side portion 202 and the plane of the second side portion 204. In the open state, the storage processor 102 is housed within the apparatus 100 and coupled to interface component 214, and meanwhile the first and second flapper components 206, 208 are positioned on both sides of the storage processor 102. In some embodiments, in the open state, the first and second flapper components 206, 208 each may be at an angle to the first side portion 202 and the second side portion 204, respectively, for example, the angle is less than 10°, less than 5°, less than 2°, or less than 1°.

Figure 11:
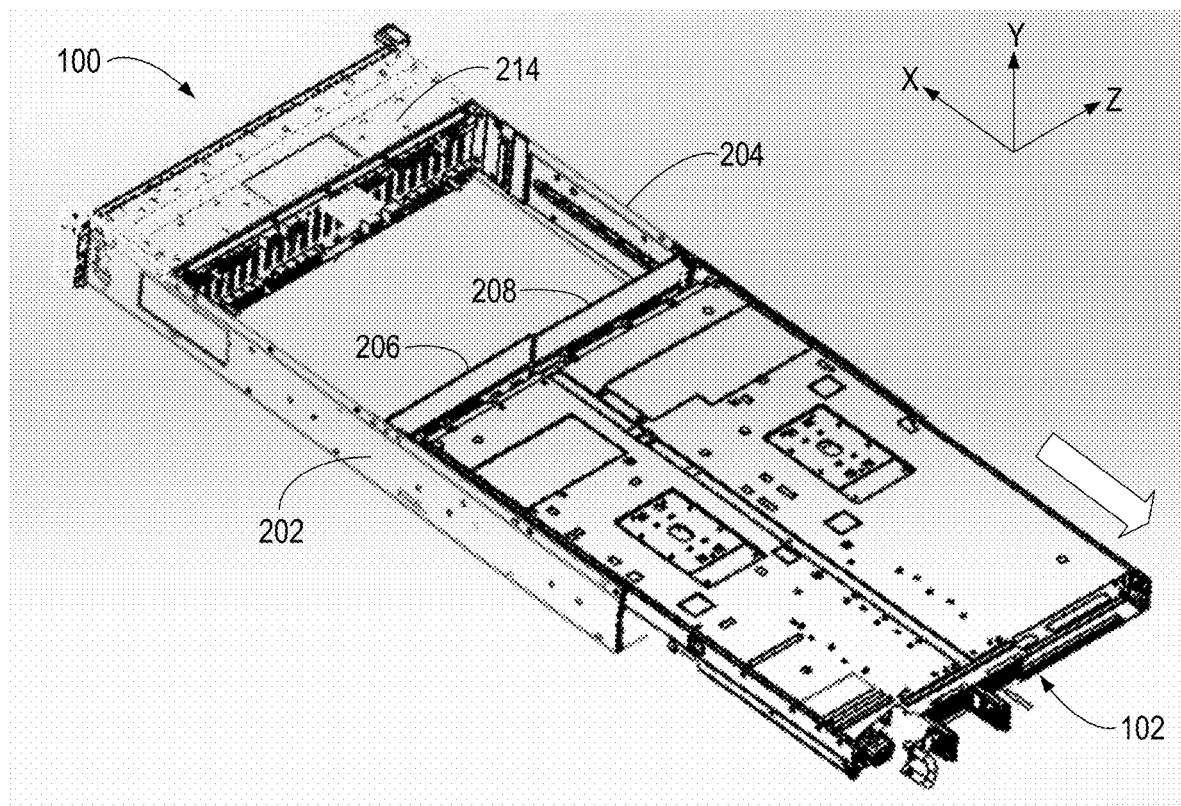
FIG. 11 illustrates a schematic diagram of pulling out a storage processor in accordance with an embodiment of the present disclosure.

FIG. 11 illustrates a schematic diagram of pulling out a storage processor in accordance with an embodiment of the present disclosure. Referring to FIG. 11, the storage processor 102 is pulled out from the apparatus 100 in a direction opposite to the first direction X, as indicated by the arrow. During the pulling-out of the storage processor 102, the first and second flapper components 206, 208 are adapted to rotate to a closed state by the restoring force of the respective spring components. In the closed state, the first and second flapper components 206, 208 are positioned parallel to the third direction Z, as shown in FIG. 11. It should be understood that during the pulling-out of the storage processor 102, the restoring forces acting on the first and second flapper components 206, 208 are designed to not interfere with the pulling-out of the storage processor 102, and enables the storage processor 102 to be pulled out from the apparatus 100 without the use of additional tools.

Figure 12:
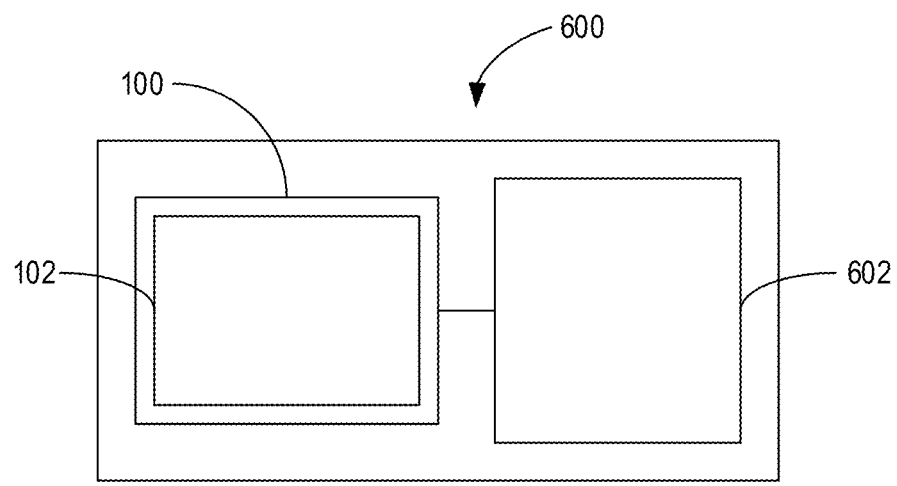
FIG. 12 illustrates a block diagram of a storage server in accordance with an embodiment of the present disclosure.

FIG. 12 illustrates a block diagram of a storage server in accordance with an embodiment of the present disclosure. Referring to FIG. 12, the storage server 600 includes a storage array 602 configured to store data, a storage processor 102 configured to be electrically coupled to the storage array 602, and the apparatus 100 for housing the storage processor 102. In some embodiments, the storage array 602 may be comprised of storage drives such as hard drives and solid state drives. In some embodiments, the storage processor 102 is configured to control the operation of the storage array 602.

In some embodiments, two storage processors 102 stacked on each other may be comprised in the storage server 600. In some embodiments, one storage processor 102 may be pulled out from the storage server 600. In some embodiments, the apparatus 100 is the above-described apparatus that includes magnetic components. In some embodiments, the apparatus 100 is part of an enclosure of the storage server 600 and is coupled to an apparatus for housing other parts such as the storage array.

The apparatus for housing the storage processor according to embodiments of the present disclosure employs a novel latching mechanism with magnetic components for coupling the flapper components to each other by a magnetic force to lock the flapper components, in order to manage the cooling airflow to prevent the backflow of the cooling airflow from entering the interior of the enclosure from above the storage processor in the storage server while ensuring sufficient cooling airflow flowing through the storage drives in the storage server, thereby significantly improving the thermal management capability of the storage server. The new design of the apparatus according to embodiments of the present disclosure is implemented in a minimum physical space, provides a high mating force to overcome the pushing force of the backflow of the cooling airflow against the flapper components, and implements latching and unlatching without using extra tools, thereby optimizing the design of the storage server for use in a hardware platform of a solution to a new-generation mainstream storage server. The apparatus according to embodiments of the present disclosure may be further utilized in other designs such as field replaceable unit design and redundant design.

It would be appreciated that although several means or sub-means (e.g., specialized circuitry) of the apparatus have been mentioned in detailed description above, such partition is only example but not limitation. Actually, according to the embodiments of the present disclosure, features and functions of two or more apparatuses described above may be instantiated in one apparatus. In turn, features and functions of one apparatus described above may be further partitioned to be instantiated by various apparatuses.

What have been mentioned above are only some optional embodiments of the present disclosure and are not limiting the present disclosure. For those skilled in the art, the present disclosure may have various alternations and changes. Any modifications, equivalents and improvements made within the spirits and principles of the present disclosure should be comprised within the scope of the present disclosure.

We claim:

1. An apparatus for housing a storage processor, comprising:
   a first side portion and a second side portion each extending in a plane defined by a first direction (X) and a second direction (Y) orthogonal to the first direction (X), the first side portion and the second side portion separated from each other in a third direction (Z) orthogonal to the first direction (X) and the second direction (Y);
   a first flapper component and a second flapper component disposed between the first side portion and the second side portion, extending in a first plane and a second plane parallel to the second direction (Y), respectively, and rotatable about a first axis and a second axis parallel to the second direction (Y), respectively, the first flapper component coupled to the first side portion and having a first end face, the second flapper component coupled to the second side portion and having a second end face; and
   a first magnetic component and a second magnetic component disposed in the first end face and the second end face, respectively, and configured to be coupled to each other by a magnetic force so as to couple the first end face to the second end face;
   wherein the first side portion and the second side portion each include an outer face defining a mounting component that is constructed and arranged to mount the apparatus on a server rack, and each include an inner face that is constructed and arranged to interface with the storage processor; and
   wherein the first flapper component is coupled to the inner face of the first side portion, and the second flapper component is coupled to the inner face of the second side portion.

2. The apparatus of claim 1, wherein the first magnetic component and the second magnetic component are further configured such that the first flapper component and the second flapper component are coupled in a manner of being positioned in parallel with the third direction (Z).

3. The apparatus of claim 2, wherein the first side portion and the second side portion are separated from each other by a predetermined distance in the third direction (Z), and respective lengths of the first flapper component and the second flapper component in the third direction (Z) are half of the predetermined distance.

4. The apparatus of claim 1, wherein the first magnetic component and the second magnetic component are further configured to decouple from each other when a pushing force applied to the first flapper component and the second flapper component is greater than a predetermined threshold.

5. The apparatus of claim 1, wherein during insertion of the storage processor into the apparatus in the first direction (X) by an external force, the first flapper component and the second flapper component are adapted to rotate to an open state under action of the external force, and the first flapper component and the second flapper component are positioned parallel to the first direction (X) in the open state.

6. The apparatus of claim 1, wherein during pulling out of the storage processor from the apparatus in a direction opposite to the first direction (X), the first flapper component and the second flapper component are adapted to rotate to a closed state under action of a restoring force, and the first flapper component and the second flapper component are positioned parallel to the third direction (Z) in the closed state.

7. The apparatus of claim 1, wherein
   the first flapper component comprises a first end and a second end opposite to the first end, the first end having the first end face, and the first flapper component coupled to the first side portion via the second end;
   the second flapper component comprises a third end and a fourth end opposite to the third end, the third end having the second end face, and the second flapper component coupled to the second side portion via the fourth end.

8. The apparatus of claim 1, wherein
   the first flapper component comprises a first recess disposed in the first end face to be adapted to house the first magnetic component;
   the second flapper component comprises a second recess disposed in the second end face to be adapted to house the second magnetic component.

9. The apparatus of claim 8, wherein a top surface of the first magnetic component is coplanar with the first end face, and a top surface of the second magnetic component is coplanar with the second end face.

10. The apparatus of claim 8, wherein at least one first magnetic component is disposed in at least one first recess, respectively, and at least one second magnetic components is disposed in at least one second recess, respectively.

11. The apparatus of claim 10, wherein the at least one first magnetic component and the at least one second magnetic component are arranged in the first end face and the second end face in the second direction (Y), respectively.

12. The apparatus of claim 1, wherein the first magnetic component has a first magnetic pole, and the second magnetic component has a second magnetic pole opposite to the first magnetic pole.

13. The apparatus of claim 1, further comprising:
   a first spring component and a second spring component configured to couple the first flapper component and the second flapper component to the first side portion and the second side portion, respectively, and enable the first flapper component and the second flapper component to rotate about the first axis and the second axis, respectively.

14. The apparatus of claim 13, wherein each of the first spring component and the second spring component comprises:
   a spring body;
   a first extension extending from one end of the spring body and coupled to one of the first side portion and the second side portion; and
   a second extension extending from an opposite end of the spring body and coupled to corresponding one of the first flapper component and the second flapper component.

15. The apparatus of claim 13, wherein the first spring component and the second spring component are further configured to provide a restoring force to the first flapper component and the second flapper component, respectively, during pulling out of the storage processor from the apparatus in a direction opposite to the first direction (X), such that the first flapper component and the second flapper component are rotated toward the direction opposite to the first direction (X).

16. The apparatus of claim 1, wherein heights of the first flapper component and the second flapper component in the second direction (Y) correspond to a height of the storage processor.

17. The apparatus of claim 16, further comprising:
a third flapper component and a fourth flapper component disposed between the first side portion and the second side portion, adjacent to the first flapper component and the second flapper component in the second direction (Y), respectively, extending in a third plane and a fourth plane parallel to the second direction (Y), respectively, and rotatable about the first axis and the second axis, respectively, the third flapper component coupled to the first side portion and having a third end face, the fourth flapper component coupled to the second side portion and having a fourth end face; and
a third magnetic component and a fourth magnetic component disposed in the third end face and the fourth end face, respectively, and configured to be coupled to each other by a magnetic force so as to couple the third end face to the fourth end face.

18. The apparatus of claim 17, wherein the third magnetic component and the fourth magnetic component are further configured such that the third flapper component and the fourth flapper component are coupled in a manner of being positioned in parallel with the third direction (Z), and further configured to decouple from each other when a pushing force applied to the third flapper component and the fourth flapper component is greater than a predetermined threshold.

19. The apparatus of claim 17, wherein
heights of the first flapper component and the second flapper component in the second direction (Y) are equal to those of the third flapper component and the fourth flapper component in the second direction (Y);
heights of the first side portion and the second side portion in the second direction (Y) are twice those of the first flapper component and the second flapper component in the second direction (Y).

20. A storage server, comprising:
a storage array configured to store data;
a storage processor configured to be electrically coupled to the storage array; and
an apparatus that houses the storage processor, the apparatus including:
 a first side portion and a second side portion each extending in a plane defined by a first direction (X) and a second direction (Y) orthogonal to the first direction (X), the first side portion and the second side portion separated from each other in a third direction (Z) orthogonal to the first direction (X) and the second direction (Y);
 a first flapper component and a second flapper component disposed between the first side portion and the second side portion, extending in a first plane and a second plane parallel to the second direction (Y), respectively, and rotatable about a first axis and a second axis parallel to the second direction (Y), respectively, the first flapper component coupled to the first side portion and having a first end face, the second flapper component coupled to the second side portion and having a second end face; and
 a first magnetic component and a second magnetic component disposed in the first end face and the second end face, respectively, and configured to be coupled to each other by a magnetic force so as to couple the first end face to the second end face;
wherein the first side portion and the second side portion each include an outer face defining a mounting component that is constructed and arranged to mount the apparatus on a server rack, and each include an inner face that is constructed and arranged to interface with the storage processor; and
wherein the first flapper component is coupled to the inner face of the first side portion, and the second flapper component is coupled to the inner face of the second side portion.

21. The apparatus of claim 1, further comprising:
a top portion coupled with the first side portion and the second side portion, and
a bottom portion coupled with the first side portion and the second side portion,
wherein the top portion, the bottom portion, the first side portion, and the second side portion form an enclosure defining an airflow inlet and an airflow outlet, and
wherein the first flapper component and the second flapper component are disposed between the top portion and the bottom portion.

22. The apparatus of claim 21, wherein the enclosure is constructed and arranged to receive a cooling airflow via the airflow inlet and discharge the cooling airflow via the airflow outlet, and
wherein the first flapper component and the second flapper component impede a backflow of the discharged cooling airflow when the first magnetic component and the second magnetic component are coupled, the backflow flowing through the enclosure from the airflow outlet towards the airflow inlet.

23. The apparatus of claim 1, wherein the first side portion defines a first flapper space to house the first flapper component when the storage processor is inserted into the apparatus and rotates the first flapper component about the first axis, and the second side portion defines a second flapper space to house the second flapper component when the storage processor is inserted into the apparatus and rotates the second flapper component about the second axis.

* * * * *